(12) United States Patent
Lee et al.

(10) Patent No.: US 12,744,500 B2
(45) Date of Patent: Sep. 22, 2026

(54) POWER AMPLIFIER

(71) Applicant: Samsung Electro-Mechanics Co., Ltd., Suwon-si (KR)

(72) Inventors: Geunyong Lee, Suwon-si (KR); Seungchul Pyo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 430 days.

(21) Appl. No.: 18/520,795

(22) Filed: Nov. 28, 2023

(65) Prior Publication Data

US 2024/0305255 A1 Sep. 12, 2024

(51) Int. Cl.
*H03F 3/24* (2006.01)
*H03F 3/72* (2006.01)

(52) U.S. Cl.
CPC ............... *H03F 3/245* (2013.01); *H03F 3/72* (2013.01); *H03F 2200/451* (2013.01); *H03F 2203/7206* (2013.01)

(58) Field of Classification Search
CPC ...... H03F 3/245; H03F 3/72; H03F 2200/451; H03F 2203/7206
USPC ........................................................ 333/296
See application file for complete search history.

(56) References Cited

U.S. PATENT DOCUMENTS 11,133,786 B2 9/2021 Chen et al.
11,303,309 B1 * 4/2022 Mobarak ............... H03F 1/0266
2014/0139291 A1 * 5/2014 Won .......................... H03F 3/21 330/296
2015/0162877 A1 * 6/2015 Ni ......................... H03F 1/0216 330/296
2020/0195209 A1 * 6/2020 Chen ......................... H03F 3/19
2021/0242835 A1 * 8/2021 Mobarak ................. H03F 3/195
2022/0278659 A1 * 9/2022 Zhao ..................... H03F 1/0233
2023/0095390 A1 * 3/2023 Lehtola ..................... H03F 3/19 330/250
2025/0167744 A1 * 5/2025 Chen ....................... H03F 3/195

FOREIGN PATENT DOCUMENTS

KR 10-1761946 B1 8/2017
KR 10-2389660 B1 4/2022

OTHER PUBLICATIONS

Jeon et al., "Highly Linear 2.6 GHz Band InGaP/GaAs HBT Power Amplifier IC Using a Dynamic Predistorter," Electronics 2025, 14, 2300. (Year: 2025).*

(Continued)

*Primary Examiner* — Hafizur Rahman
(74) *Attorney, Agent, or Firm* — NSIP Law

(57) ABSTRACT

A power amplifier includes a first power transistor configured to amplify an input radio-frequency (RF) signal, and output the amplified input RF signal as an output RF signal; a first transistor including a first terminal configured to provide a first bias current to the first power transistor; and a first linearizing circuit connected between a terminal of the first power transistor from which the output RF signal is output and the first terminal of the first transistor and configured to couple a portion of the output RF signal to the first terminal of the first transistor.

20 Claims, 9 Drawing Sheets

(56) References Cited

OTHER PUBLICATIONS

Mariappan et al., "A Wideband CMOS Power Amplifier with Integrated Digital Linearizer and Tunable Transformer", 2021 IEEE Asia Pacific Conference on Circuits and Systems (APCCAS), Nov. 22-26, 2021. (Year: 2021).*

Tsai et al., Design and Analysis of a 44-GHz MMIC Low-Loss Built-In Linearizer for High-Linearity Medium Power Amplifiers, IEEE Transactions on Microwave Theory and Techniques, vol. 54, No. 6, Jun. 2006 (Year: 2006).*

Becskei et al., "Linearization through distortion: a new facet of negative feedback in signalling", Molecular Systems Biology 5; Article No. 255; doi:10.1038/msb.2009.14 Citation: Molecular Systems Biology 5:255 & 2009 EMBO and Macmillan Publishers. (Year: 2009).*

Choi, et al., Power MOSFET Linearizer of a High-Voltage Power Amplifier for High-Frequency Pulse-Echo Instrumentation, Sensors 2017, 17, 764; doi:10.3390/s17040764 (Year: 2017).*

Dr. Steve Arar, "Using Analog Predistortion for RF Power Amplifier Linearization", All About Circuits, Apr. 2025 (Year: 2025).*

* cited by examiner

1000b
Bias circuit
200a
$I_{REF1}$
$V_{BAT1}$
$I_{BIAS1}$
Na
$R_{B1}$
IN_100a
$RF_{IN}$
Linearizing circuit
300a
$P_{OUT}$
$P_{IN}$
$V_{CC1}$
$RF_{OUT}$
OUT_100a
100a
Linearizing circuit
300b
$P_{IN}$
$P_{OUT}$
Bias circuit
200b
$I_{REF2}$
$V_{BAT2}$
$I_{BIAS2}$
Nb
$R_{B2}$
IN_100b
$V_{CC2}$
OUT_100b
$RF_{OUT\_F}$
100b 1000c
Bias circuit
200a
Bias circuit
200b
Linearizing circuit
300a
Linearizing circuit
300b
SW1_1 (ON)
SW1_2 (ON)
SW2_1 (OFF)
SW2_2 (OFF)
100a
100b
IN_100a
IN_100b
OUT_100a
OUT_100b
Na
Nb

POWER AMPLIFIER

CROSS-REFERENCE TO RELATED APPLICATIONS

This application claims the benefit under 35 USC 119(a) of Korean Patent Application No. 10-2023-0029933 filed on Mar. 7, 2023, in the Korean Intellectual Property Office, the entire disclosure of which is incorporated herein by reference for all purposes.

BACKGROUND

1. Field

The present disclosure relates to a power amplifier.

2. Description of Related Art

With the evolution of communications standards, wireless communication systems have adopted various digital modulation and demodulation techniques. The existing CDMA (Code-Division Multiple Access) communication systems are adopting the QPSK (Quadrature Phase Shift Keying) technique, and wireless LANs according to IEEE standards for communications are adopting the OFDM (Orthogonal Frequency-Division Multiplexing) technique. Furthermore, LTE (Long-Term Evolution) and LTE Advanced, which are the standards in 3GPP, are adopting the QPSK, QAM (Quadrature Amplitude Modulation), and OFDM techniques. These wireless communication standards use linear modulation schemes in which the magnitude or phase of a transmission signal is required to be maintained during transmission.

On the other hand, in the recent standard for sub-6 GHz 5G, the linearity of communication systems has been becoming more important as the channel bandwidth has been increasing. Furthermore, high output power has been needed for power amplifiers to be included in communication systems. Accordingly, the linearity of power amplifiers relative to the output power has been becoming more important.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power amplifier includes a first power transistor configured to amplify an input radio-frequency (RF) signal, and output the amplified input RF signal as an output RF signal; a first transistor including a first terminal configured to provide a first bias current to the first power transistor; and a first linearizing circuit connected between a terminal of the first power transistor from which the output RF signal is output and the first terminal of the first transistor and configured to couple a portion of the output RF signal to the first terminal of the first transistor.

The power amplifier may further includes a second power transistor configured to amplify the output RF signal of the first power transistor; a second transistor including a first terminal configured to provide a second bias current to the second power transistor; and a second linearizing circuit connected between a terminal of the first power transistor to which the input RF signal is input and the first terminal of the second transistor and configured to couple a portion of the input RF signal to the first terminal of the second transistor.

The first linearizing circuit may include a capacitor connected between the terminal of the first power transistor from which the output RF signal is output and the first terminal of the first transistor.

The first linearizing circuit may further include a resistor connected in series with the capacitor between the terminal of the first power transistor from which the output RF signal is output and the first terminal of the first transistor.

The first linearizing circuit may further include an inductor connected in series with the capacitor between the terminal of the first power transistor from which the output RF signal is output and the first terminal of the first transistor.

The power amplifier may further include a resistor connected between the first terminal of the first transistor and an input terminal of the first power transistor.

The power amplifier may further include a capacitor connected between a base of the first transistor and a ground, wherein the first terminal of the first transistor may be an emitter of the first transistor.

In another general aspect, a power amplifier includes a first power transistor configured to amplify an input radio-frequency (RF) signal and output the amplified input RF signal as an output RF signal; a first bias circuit configured to generate a first bias current for biasing the first power transistor and including a first terminal from which the first bias current is output; a second power transistor configured to amplify the output RF signal; a second bias circuit configured to generate a second bias current for biasing the second power transistor and including a first terminal from which the second bias current is output; and a first linearizing circuit including an input terminal connected to a terminal of the first power transistor from which the output RF signal is output and configured to couple a portion of the output RF signal, wherein the first linearizing circuit is further configured to provide the coupled output RF signal to the first terminal of the first bias circuit in a first power mode, and provide the coupled output RF signal to the first terminal of the second bias circuit in a second power mode.

The power amplifier may further include a second linearizing circuit including an input terminal connected to a terminal of the first power transistor to which the input RF signal is input and configured to couple a portion of the input RF signal, wherein the second linearizing circuit is further configured to provide the coupled input RF signal to the first terminal of the second bias circuit in the first power mode, and provide the coupled input RF signal to the first terminal of the first bias circuit in the second power mode.

An input power of the input RF signal of the first power transistor in the first power mode may be lower than the input power of the input RF signal of the first power transistor in the second power mode.

The power amplifier may further include a first switch connected between an output terminal of the first linearizing circuit and the first terminal of the first bias circuit; a second switch connected between the output terminal of the first linearizing circuit and the first terminal of the second bias circuit; a third switch connected between an output terminal of the second linearizing circuit and the first terminal of the second bias circuit; and a fourth switch connected between the output terminal of the second linearizing circuit and the first terminal of the first bias circuit.

The first switch and the third switch may be configured to be turned on in the first power mode, and the second switch and the fourth switch may be configured to be turned off in the first power mode, and the second switch and the fourth switch may be further configured to be turned on in the second power mode, and the first switch and the third switch may be further configured to be turned off in the second power mode.

The power amplifier may further include a first resistor connected between the first terminal of the first bias circuit and an input terminal of the first power transistor; and a second resistor connected between the first terminal of the second bias circuit and an input terminal of the second power transistor.

The first bias circuit may include a first transistor, and an emitter of the first transistor may be the first terminal of the first bias circuit, and the second bias circuit may include a second transistor, and an emitter of the second transistor may be the first terminal of the second bias circuit.

In another general aspect, a power amplifier includes a first power transistor including an input terminal and an output terminal, the input terminal of the first power transistor being configured to receive an input radio-frequency (RF) signal, and the first power transistor being configured to amplify the input radio-frequency RF signal and output the amplified input RF signal as an output RF signal from the output terminal of the first power transistor; a first transistor including a first terminal configured to provide a first bias current to the first power transistor; and a first linearizing circuit connected between the output terminal of the first power transistor and the first terminal of the first transistor and configured to compensate for a drop in a voltage of the input terminal of the first power transistor as an output power of the output RF signal of the first power transistor increases based on the output RF signal of the first power transistor.

The first linearizing circuit may be further configured to compensate for the drop in the voltage of the input terminal of the first power transistor by coupling a portion of the output RF signal of the first power transistor to the first terminal of the first transistor.

The power amplifier may further include a second power transistor including an input terminal and an output terminal, the input terminal of the second power transistor being configured to receive the output RF signal of the first power transistor, and the second power transistor being configured to amplify the output RF signal of the first power transistor and output the amplified output RF signal as a final output RF signal from the output terminal of the second power transistor; a second transistor including a first terminal configured to provide a second bias current to the second power transistor; and a second linearizing circuit connected between the input terminal of the first power transistor and the first terminal of the second transistor and configured to compensate for a drop in a voltage of the input terminal of the second power transistor as an output power of the final output RF signal of the second power transistor increases based on the input RF signal of the first power transistor.

The second linearizing circuit may be further configured to compensate for the drop in the voltage of the input terminal of the second power transistor by coupling a portion of the input RF signal of the first power transistor to the first terminal of the second transistor.

The power amplifier may further include a first switch connected between an output terminal of the first linearizing circuit and the first terminal of the first transistor; a second switch connected between the output terminal of the first linearizing circuit and the first terminal of the second transistor; a third switch connected between an output terminal of the second linearizing circuit and the first terminal of the second transistor; and a fourth switch connected between the output terminal of the second linearizing circuit and the first terminal of the first transistor.

The first switch and the third switch may be configured to be turned on in a first power mode, and the second switch and the fourth switch are configured to be turned off in the first power mode, the second switch and the fourth switch may be further configured to be turned on in the second power mode, the first switch and the third switch may be further configured to be turned off in the second power mode, and an input power of the input RF signal of the first power transistor in the first power mode may be lower than the input power of the input RF signal of the first power transistor in the second power mode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
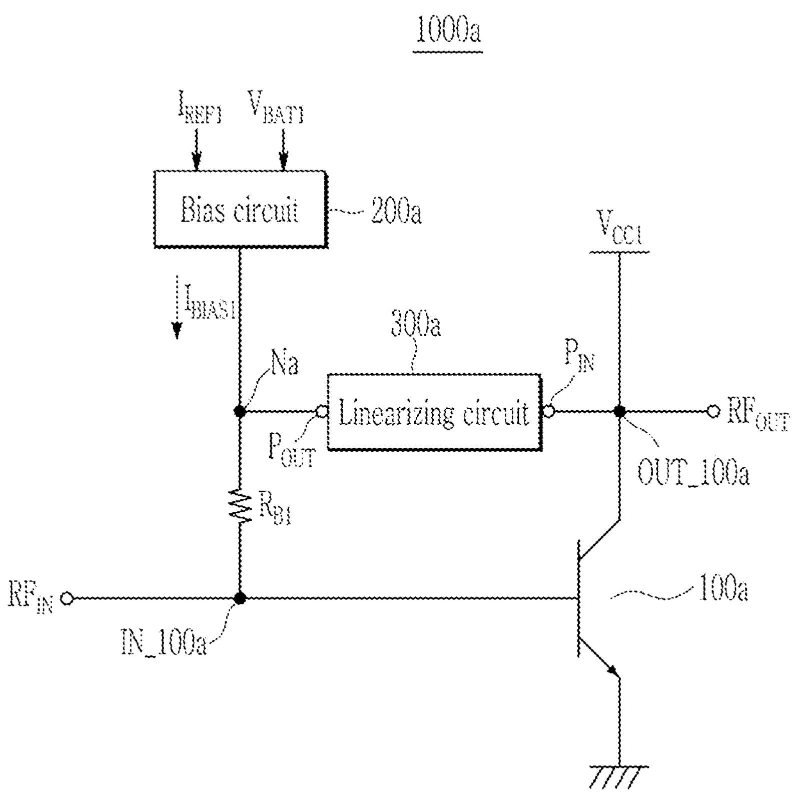
FIG. 1 is a drawing illustrating a power amplifier according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The use of the term "may" with respect to an example or embodiment, e.g., as to what an example or embodiment may include or implement, means that at least one example or embodiment exists in which such a feature is included or implemented, while all examples and embodiments are not necessarily limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this application, an RF signal may have a format according to Wi-Fi (such as IEEE 802.11 family, etc.), WiMAX (IEEE 802.16 family, etc.), IEEE 802.20, LTE (Long-Term Evolution), EV-DO, HSDPA, HSUPA, HSPA, HSPA+, EDGE, GSM, GPS, GPRS, CDMA, TDMA, DECT, Bluetooth, 3G, 4G, 5G, and any other wireless and wired communication protocols designated hereafter, but is not limited thereto.

FIG. 1 is a drawing illustrating a power amplifier according to an embodiment.

Referring to FIG. 1, a power amplifier 1000*a* may include a power transistor 100*a*, a bias circuit 200*a*, and a linearizing circuit 300*a*.

In FIG. 1, an input RF signal input to the power amplifier 1000*a* is denoted by "$RF_{IN}$", and an output RF signal output from the power amplifier 1000*a* is denoted by "$RF_{OUT}$".

The power transistor 100*a* may include an input terminal IN_100*a* and an output terminal OUT_100*a*. The input terminal IN_100*a* may be a base of the power transistor 100*a*, and the output terminal OUT_100*a* may be a collector of the power transistor 100*a*. The power transistor 100*a* may amplify a power of the input RF signal $RF_{IN}$ input to the input terminal IN_100*a* (i.e., the base), and output the amplifier power through the output terminal OUT_100*a* (i.e., the collector). In other words, the input terminal IN_100*a* of the power transistor 100*a* may receive the input RF signal $RF_{IN}$, and the output terminal OUT_100*a* of the power transistor 100*a* may output the output RF signal $RF_{OUT}$. An emitter of the power transistor 100*a* may be connected to a ground. Although not shown in FIG. 1, a resistor may be additionally connected between the emitter of the power transistor 100*a* and the ground. Furthermore, the collector of the power transistor 100*a* may be connected to a power voltage $V_{CC1}$, and the power transistor 100*a* may be operated by the power voltage $V_{CC1}$. Alternatively, the collector of the power transistor 100*a* may be connected to the power voltage $V_{CC1}$ through an inductor (not shown in FIG. 1) that performs an RF choke function.

The power transistor 100*a* may be any of various types of transistors such as heterojunction bipolar transistors (HBTs), bipolar junction transistors (BJTs), and insulated gate bipolar transistors (IGBTs). Furthermore, although the power transistor 100*a* is shown in FIG. 1 as being an n-type transistor, it may be replaced with a p-type transistor.

The bias circuit 200*a* may receive a reference current $I_{REF1}$ and a power voltage $V_{BAT1}$ from outside the power amplifier 1000*a*. The power voltage $V_{BAT1}$ may be a voltage supplied from a battery. The bias circuit 200*a* may generate a bias current $I_{BIAS1}$ required for the power transistor 100*a* based on the reference current $I_{REF1}$ and the power voltage $V_{BAT1}$. The bias current $I_{BIAS1}$ may be supplied to the input terminal IN_100*a* of the power transistor 100*a* through a resistor $R_{B1}$, and a bias level (bias point) of the power transistor 100*a* may be set by the bias current $I_{BIAS1}$.

The power amplifier 1000*a* may further include the resistor $R_{B1}$. The resistor $R_{B1}$ may be connected between the bias circuit 200*a* and the input terminal IN_100*a* of the power transistor 100*a*. The resistor $R_{B1}$ may be a ballast resistor that improves heat dissipation characteristics of the power amplifier 1000*a*. In FIG. 1, a node at which the bias circuit 200*a* and the resistor $R_{B1}$ are connected to each other is denoted by "Na". Although the resistor $R_{B1}$ is shown in FIG. 1 as a separate component not included in the bias circuit 200*a*, the resistor $R_{B1}$ may be included in the bias circuit 200*a*.

The linearizing circuit 300*a* may include an input terminal $P_{IN}$ and an output terminal $P_{OUT}$. The input terminal $P_{IN}$ of the linearizing circuit 300*a* may be connected to the output terminal OUT_100*a* of the power transistor 100*a*, and the output terminal $P_{OUT}$ of the linearizing circuit 300*a* may be connected to the node Na. In other words, the linearizing circuit 300*a* may be connected between the output terminal OUT_100*a* of the power transistor 100*a* and the node Na. The linearizing circuit 300*a* can improve the linearity of the power transistor 100*a* relative to an output power of the power transistor 100*a*. As the output power (i.e., a gain) of the power transistor 100*a* increases, a drop in the voltage of the base of the power transistor 100*a* (a base voltage drop) may occur. In this case, the linearizing circuit 300*a* can compensate for the drop in the voltage of the base of the power transistor 100*a* based on the output RF signal $RF_{OUT}$.

As the output power (gain) of the power transistor 100*a* increases, the bias current $I_{BIAS1}$ may increase. An increase in the bias current $I_{BIAS1}$ may cause a rise in a voltage difference between both ends of the resistor $R_{B1}$, which may cause a drop in the base voltage of the power transistor 100*a*. The linearizing circuit 300*a* can compensate for the drop in the base voltage of the power transistor 100*a*. The linearizing circuit 300*a* may couple an output RF signal $RF_{OUT}$, not an input RF signal $RF_{IN}$. By the linearizing circuit 300*a*, a portion of the output RF signal $RF_{OUT}$ may be coupled and output to the node Na. Hereinafter, an output RF signal $RF_{OUT}$ that is coupled will be referred to as a "coupled output RF signal". The specific configuration and operation of the linearizing circuit 300*a* will be described below in more detail.

Although not shown in FIG. 1, the power amplifier 1000*a* may further include a coupling capacitor connected to the input terminal IN_100*a* (i.e., the base) of the power transistor 100*a*. The coupling capacitor may perform a function of blocking a direct current (DC) component of the input RF signal $RF_{IN}$.

Furthermore, although not shown in FIG. 1, the power amplifier 1000*a* may further include an input matching network and an output matching network. The input matching network may be connected to the input terminal IN_100*a* of the power transistor 100*a*, and may perform impedance matching between the input RF signal $RF_{IN}$ and the power transistor 100*a*. The output matching network may be connected to the output terminal OUT_100*a* (i.e., the collector) of the power transistor 100*a*, and may perform impedance matching between the output RF signal $RF_{OUT}$ and a next stage (i.e., a next stage of the power amplifier 1000*a*). Each of the input matching network and the output matching network may be implemented with at least one combination of resistors, inductors, and capacitors.

Figure 2:
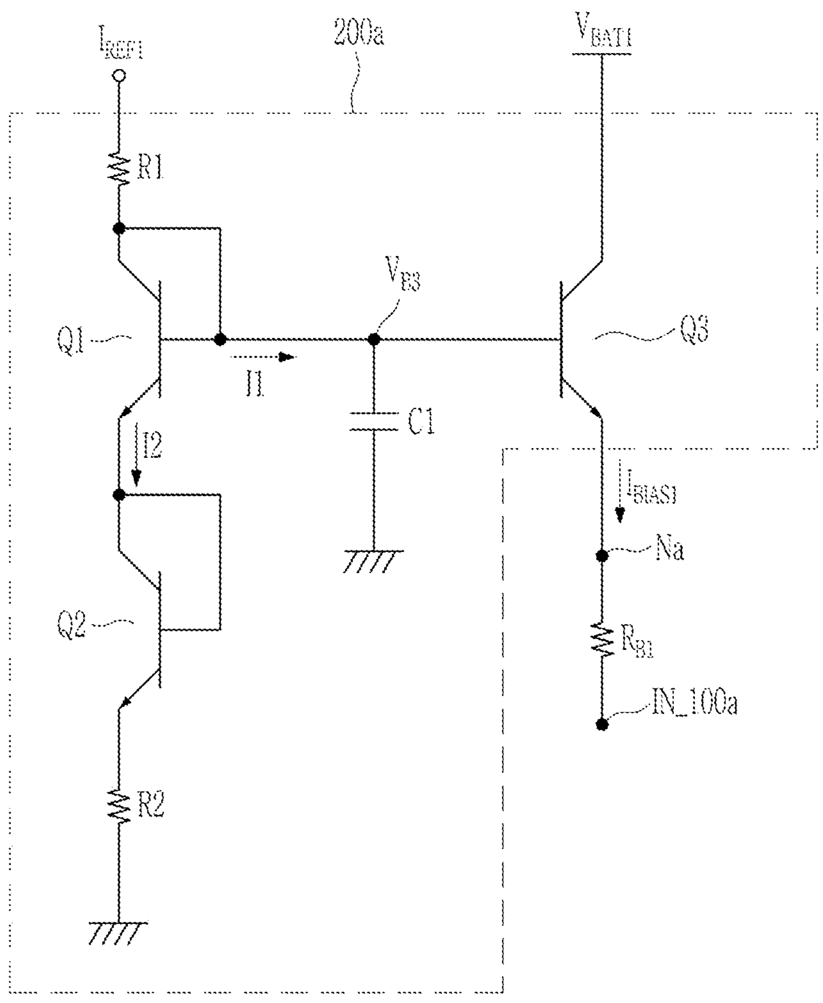
FIG. 2 is a drawing illustrating a bias circuit of the power amplifier of FIG. 1.

FIG. 2 is a drawing illustrating the bias circuit of FIG. 1.

Referring to FIG. 2, the bias circuit 200*a* may include a transistor Q1, a transistor Q2, a transistor Q3, a resistor R1, a resistor R2, and a capacitor C1.

The transistors Q1 to Q3 may be any of various types of transistors such as heterojunction bipolar transistors (HBTs), bipolar junction transistors (BJTs), and insulated gate bipolar transistors (IGBTs). Furthermore, although the transistors Q1 to Q3 are shown in FIG. 2 as being n-type transistors, they may be replaced with p-type transistors. A base of each of the transistors Q1 to Q3 serves as a control terminal of the corresponding transistor, so it will also referred to as a "control terminal. A collector of each of the transistors Q1 to Q3 is one terminal of the corresponding transistor, so it will also be referred to as a "first terminal" or a "second terminal". An emitter of each of the transistors Q1 to Q3 is another terminal of the corresponding transistor, so it will also be referred to as a "second terminal" or a "first terminal".

The base and the collector of the transistor Q1 may be connected to each other, and the collector of the transistor Q1 may receive the reference current $I_{REF1}$ through the resistor R1. Thus, the transistor Q1 may have a diode-connected structure. The transistor Q1 serves to sink a current I2 from the reference current $I_{REF1}$. The reference current $I_{REF1}$ may be a current source.

The base and the collector of the transistor Q2 may be connected to each other, and the collector of the transistor Q2 may be connected to the emitter of the transistor Q1. Thus the transistor Q2 may have a diode-connected structure, and the emitter of the transistor Q2 may be connected to the ground.

Furthermore, the resistor R2 may be connected between the emitter of the transistor Q2 and the ground.

The collector of the transistor Q3 may be connected to the power voltage $V_{BAT1}$, and the base of the transistor Q3 may be connected to the base of the transistor Q1. In FIG. 2, the base voltage of the transistor Q3 is denoted by '$V_{B3}$'. Furthermore, the emitter of the transistor Q3 may be connected to the input terminal IN_100*a* of the power transistor 100*a* through the resistor $R_{B1}$. In other words, the emitter of the transistor Q3 may supply the bias current $I_{BIAS1}$ to the power transistor 100*a* through the resistor $R_{B1}$. As shown in FIG. 2, the node Na described with reference to FIG. 1 may be a node at which the transistor Q3 and the resistor $R_{B1}$ are connected to each other.

The capacitor C1 may be connected between the base of the transistor Q3 and the ground. The capacitor C1 may serve to reduce the impedance of the transistor Q3 while stabilizing the base voltage $V_{B3}$ of the transistor Q3.

The reference current $I_{REF1}$ may be divided into a current I1 and the current I2, and the current I1 may be input to the base of the transistor Q3. Accordingly, the bias current $I_{BIAS1}$ may be determined depending on the current I1. Furthermore, the bias current $I_{BIAS1}$ may be determined depending on the base voltage $V_{B3}$ of the transistor Q3. As an example, as the base voltage $V_{B3}$ of the transistor Q3 increases, the bias current $I_{BIAS1}$ may increase.

As described with reference to FIG. 1, the linearizing circuit 300*a* may output a coupled output RF signal to the node Na. The coupled output RF signal is input to the emitter of the transistor Q3, causing the bias current $I_{BIAS1}$ to increase. By the increase in the bias current $I_{BIAS1}$, a drop in the base voltage of the power transistor 100*a* can be compensated. In other words, the linearizing circuit 300*a* can compensate for a drop in the base voltage of the power transistor 100*a*.

Depending on the magnitude of the coupled output RF signal, the extent to which the drop in the base voltage of the power transistor 100*a* is compensated may vary. As the magnitude of the coupled output RF signal increases, a drop in the base voltage of the power transistor 100*a* can be more greatly compensated. Since the magnitude (power) of the output RF signal $RF_{OUT}$ is larger than the magnitude of the input RF signal $RF_{IN}$, the linearizing circuit 300*a* may couple the output RF signal $RF_{OUT}$, not the input RF signal $RF_{IN}$. Accordingly, the linearizing circuit 300*a* can further improve the linearity by compensating more greatly for a drop in the base voltage of the power transistor 100*a*.

Hereinafter, various examples of the linearizing circuit 300*a* will be described with respect to following FIG. 3A to FIG. 3C.

Figure 3A:
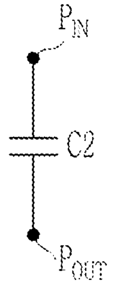
FIG. 3A is a drawing illustrating an example of a linearizing circuit of the power amplifier of FIG. 1.

FIG. 3A is a drawing illustrating an example of a linearizing circuit of FIG. 1.

Referring to FIG. 3A, the linearizing circuit 300*a* may include the input terminal $P_{IN}$ and the output terminal $P_{OUT}$. The input terminal $P_{IN}$ may correspond to the output terminal of the power transistor 100*a*, and the output terminal $P_{OUT}$ may correspond to the node Na. The input terminal $P_{IN}$ of the linearizing circuit 300*a* may receive an RF signal to be coupled, and the output terminal $P_{OUT}$ of the linearizing circuit 300*a* may output a coupled RF signal.

The example of the linearizing circuit 300*a* may include a capacitor C2. The capacitor C2 may be connected between the input terminal $P_{IN}$ and the output terminal $P_{OUT}$. The capacitor C2 may couple a portion of an output RF signal $RF_{OUT}$ input to the input terminal $P_{IN}$, and output the coupled RF signal to the output terminal $P_{OUT}$ (i.e., the node Na).

Figure 3B:
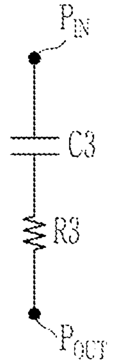
FIG. 3B is a drawing illustrating another example of the linearizing circuit of the power amplifier of FIG. 1.

FIG. 3B is a drawing illustrating another example of the linearizing circuit of FIG. 1.

Referring to FIG. 3B, another example of the linearizing circuit 300*a* may include a capacitor C3 and a resistor R3.

One terminal of the capacitor C3 may be connected to the input terminal $P_{IN}$, and the resistor R3 may be connected between the other terminal of the capacitor C3 and the output terminal $P_{OUT}$. Alternatively, the positions of the capacitor C3 and the resistor R3 may be exchanged with each other. In other words, one terminal of the resistor R3 may be connected to the input terminal $P_{IN}$, and the capacitor C3 may be connected between the other terminal of the resistor R3 and the output terminal $P_{OUT}$.

In other words, between the output terminal OUT_100*a* of the power transistor 100*a* and the node Na, the capacitor C3 and the resistor R3 may be connected in series with each other. The capacitor C3 and the resistor R3 may couple a portion of the output RF signal $RF_{OUT}$ input to the input terminal $P_{IN}$, and output the coupled RF signal to the output terminal $P_{OUT}$ (i.e., the node Na).

Figure 3C:
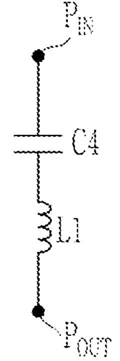
FIG. 3C is a drawing illustrating another example of the linearizing circuit of the power amplifier of FIG. 1.

FIG. 3C is a drawing illustrating another example of the linearizing circuit of FIG. 1.

Referring to FIG. 3C, another example of the linearizing circuit 300*a* may include a capacitor C4 and an inductor L1.

One terminal of the capacitor C4 may be connected to the input terminal $P_{IN}$, and the inductor L1 may be connected between the other terminal of the capacitor C4 and the output terminal $P_{OUT}$. Alternatively, the positions of the capacitor C4 and the inductor L1 may be exchanged with each other. In other words, one terminal of the inductor L1 may be connected to the input terminal $P_{IN}$, and the capacitor C4 may be connected between the other terminal of the inductor L1 and the output terminal $P_{OUT}$.

Consequently, between the output terminal OUT_100*a* of the power transistor 100*a* and the node Na, the capacitor C4 and the inductor L1 may be connected in series with each other. The capacitor C4 and the inductor L1 may couple a portion of the output RF signal $RF_{OUT}$ input to the input terminal $P_{IN}$, and output the coupled RF signal to the node Na.

Figure 4:
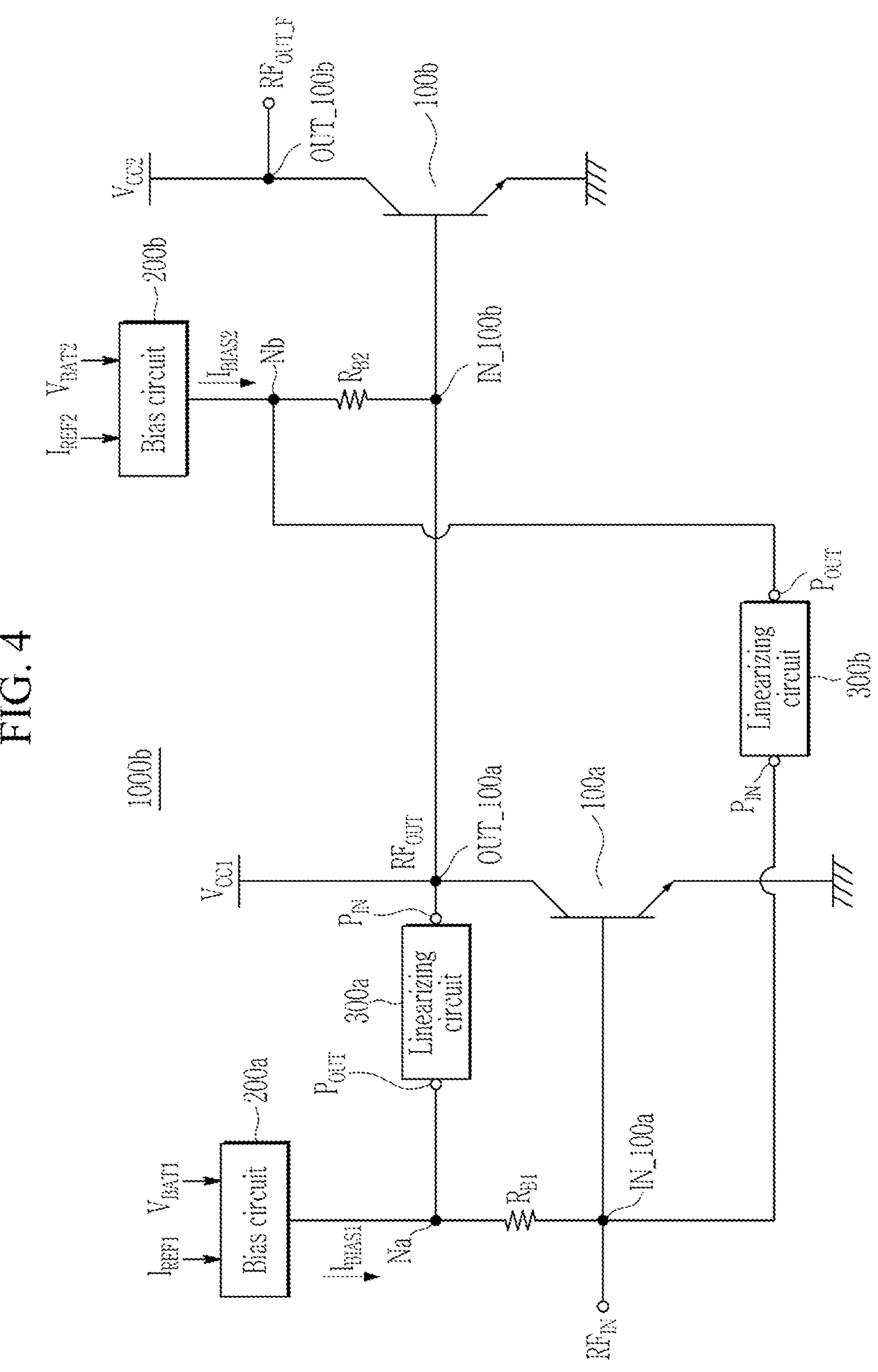
FIG. 4 is a drawing illustrating a power amplifier according to another embodiment.

FIG. 4 is a drawing illustrating a power amplifier according to another embodiment.

Referring to FIG. 4, a power amplifier 1000*b* has a multi-stage power amplifier structure. The power amplifier 1000*b* may further include a power transistor 100*b*, a bias circuit 200*b*, and a linearizing circuit 300*b*, in addition to components identical to those in the power amplifier 1000*a* in FIG. 1. The power transistor 100*a*, the bias circuit 200*a*, and the linearizing circuit 300*a* constitute a first-stage power amplifier, and have the same configuration as in FIG. 1. Furthermore, the power transistor 100*b*, the bias circuit 200*b*, and the linearizing circuit 300*b* constitute a second-stage power amplifier, which will be described below.

The power transistor 100*b* may include an input terminal IN_100*b* and an output terminal OUT_100*b*. The input terminal IN_100*b* may be a base of the power transistor 100*b*, and the output terminal OUT_100*b* may be a collector of the power transistor 100*b*. The input terminal IN_100*b* of the power transistor 100*b* may be connected to the output terminal OUT_100*a* of the power transistor 100*a*. The power transistor 100*b* may amplify the output RF signal $RF_{OUT}$ of the power transistor 100*a*, and output a final output RF signal $RF_{OUT}$F to the output terminal OUT_100*b*. An emitter of the power transistor 100*b* may be connected to the ground. Although not shown in FIG. 4, a resistor may be additionally connected between the emitter of the power transistor 100*b* and the ground. Although not shown in FIG. 4, a coupling capacitor may be additionally connected between the output terminal OUT_100*a* of the power transistor 100*a* and the input terminal IN_100*b* of the power transistor 100*b*. Furthermore, the collector of the power transistor 100*b* may be connected to a power voltage $V_{CC2}$, and the power transistor 100*b* may be operated by the power voltage $V_{CC2}$. Alternatively, the collector of the power transistor 100*b* may be connected to the power voltage $V_{CC2}$ through an inductor (not shown in FIG. 4) that performs an RF choke function.

The power transistor 100*b* may be any of various types of transistors such as heterojunction bipolar transistors (HBTs), bipolar junction transistors (BJTs), and insulated gate bipolar transistors (IGBTs). Furthermore, although the power transistor 100*b* is shown in FIG. 4 as being an n-type transistor, it may be replaced with a p-type transistor.

The bias circuit 200*b* may receive a reference current $I_{REF2}$ and a power voltage $V_{BAT2}$ from outside the power amplifier 1000*b*. The power voltage $V_{BAT2}$ may be a voltage supplied from a battery. The bias circuit 200*b* may generate a bias current $I_{BIAS2}$ required for the power transistor 100*b* based on the reference current $I_{REF2}$ and the power voltage $V_{BAT2}$. The bias current $I_{BIAS2}$ may be supplied to the input terminal IN_100*b* of the power transistor 100*b* through a resistor $R_{B2}$, and a bias level (bias point) of the power transistor 100*b* may be set by the bias current $I_{BIAS2}$. Furthermore, the bias circuit 200*b* may have the same configuration as that of the bias circuit 200*a* in FIG. 2 except that the reference current $I_{REF2}$ and the power voltage $V_{BAT2}$ are used in place of the reference current $I_{REF1}$ and the power voltage $V_{BAT1}$.

The power amplifier 1000*b* may further include the resistor $R_{B2}$. The resistor $R_{B2}$ may be connected between the bias circuit 200*b* and the input terminal IN_100*b* of the power transistor 100*b*. The resistor $R_{B2}$ may be a ballast resistor that improves heat dissipation characteristics of the power amplifier 1000*b*. In FIG. 4, a node at which the bias circuit 200*b* and the resistor $R_{B2}$ are connected to each other is denoted by 'Nb". Although the resistor $R_{B2}$ is shown in FIG. 4 as a separate component not included in the bias circuit 200*b*, the resistor $R_{B2}$ may be included in the bias circuit 200*b*.

The linearizing circuit 300*b* may include an input terminal $P_{IN}$ and an output terminal $P_{OUT}$. The input terminal $P_{IN}$ of the linearizing circuit 300*b* may be connected to the input terminal IN_100*a* of the power transistor 100*a*, and the output terminal $P_{OUT}$ of the linearizing circuit 300*b* may be connected to the node Nb. In other words, the linearizing circuit 300*b* may be connected between the input terminal IN_100*a* of the power transistor 100*a* and the node Nb. The linearizing circuit 300*b* can improve the linearity of the power transistor 100*b* relative to an output power of the power transistor 100*b*. As the output power (i.e., a gain) of the power transistor 100*b* increases, a drop in a voltage of the base of the power transistor 100*b* (a base voltage drop) may occur. In this case, the linearizing circuit 300*b* can compensate for the drop in the voltage of the base of the power transistor 100*b* based on the input RF signal $RF_{IN}$. In other words, the linearizing circuit 300*b* may couple a portion of the input RF signal $RF_{IN}$, and output the coupled RF signal to the node Nb, thereby compensating for the drop in the base voltage of the power transistor 100*b*. Various examples of the linearizing circuit 300*b* may have the same configurations as those in FIG. 3A to FIG. 3C. The input terminal $P_{IN}$ of the linearizing circuit 300*b* may correspond to the input terminal IN_100*a* of the power transistor 100*a*, and the output terminal $P_{OUT}$ of the linearizing circuit 300*b* may correspond to the node Nb.

Although not shown in FIG. 4, a coupling capacitor may be additionally connected between the output terminal OUT_100*a* of the power transistor 100*a* and the input terminal IN_100*b* of the power transistor 100*b*. Furthermore, between the output terminal OUT_100*a* of the power transistor 100*a* and the input terminal IN_100*b* of the power transistor 100*b*, an interstage matching network may be additionally connected.

Figure 5:
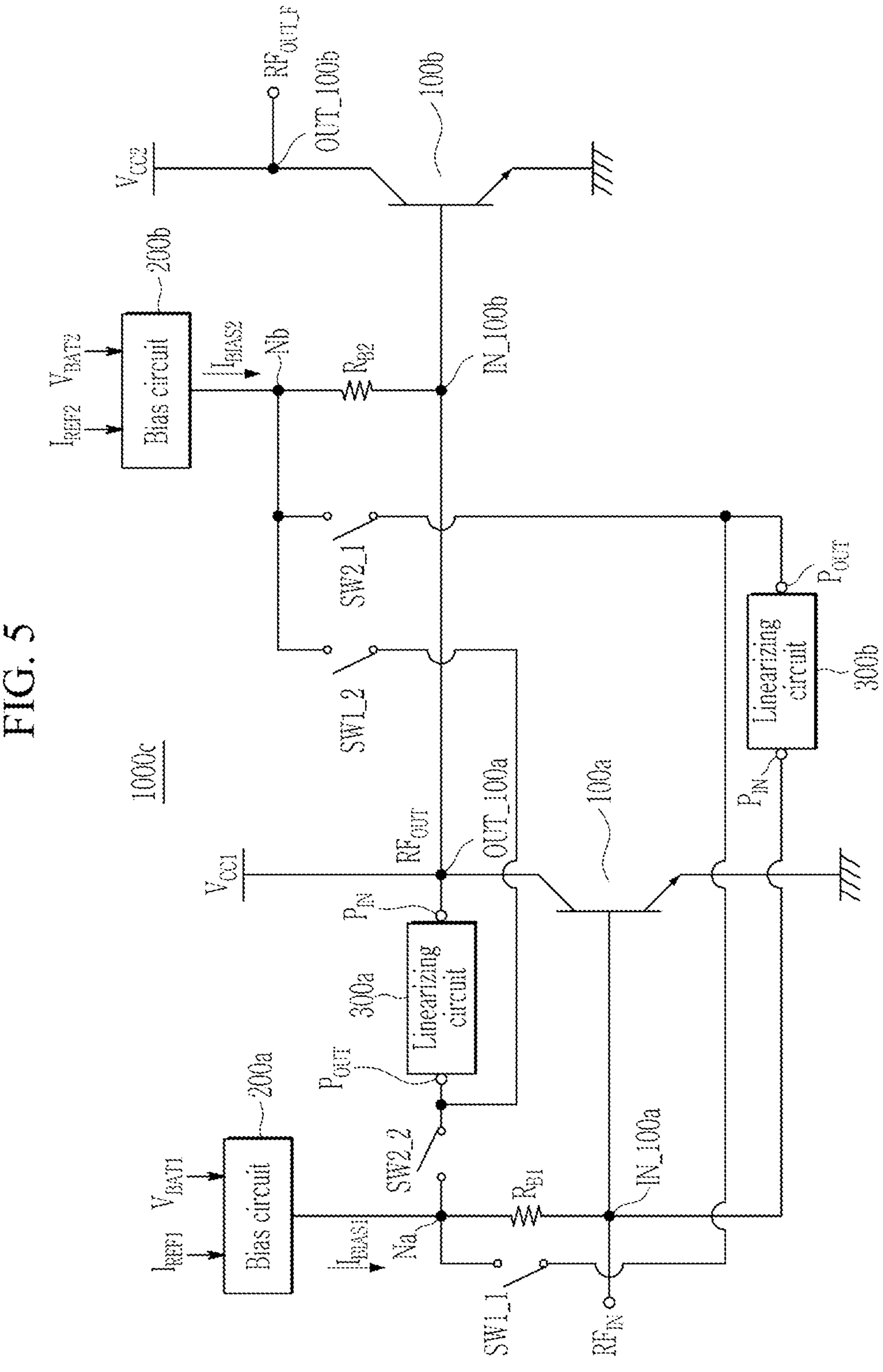
FIG. 5 is a drawing illustrating a power amplifier according to another embodiment.

FIG. 5 is a drawing illustrating a power amplifier according to another embodiment.

Referring to FIG. 5, a power amplifier 1000*c* is similar to the power amplifier 1000*b* in FIG. 5 except that it further includes a plurality of switches configured to be switched depending on a power mode of the power amplifier 1000*c*. The power amplifier 1000*c* may further include a switch SW1_1, a switch SW1_2, a switch SW2_1, and a switch SW2_2 in addition to components identical to those in the power amplifier 1000*b* in FIG. 4.

The input terminal $P_{IN}$ of the linearizing circuit 300*a* may be connected to the output terminal OUT_100*a* of the power transistor 100*a*, and the linearizing circuit 300*a* may couple a portion of the output RF signal $RF_{OUT}$.

The switch SW2_2 may be connected between the output terminal $P_{OUT}$ of the linearizing circuit 300*a* and the node Na. The switch SW1_2 may be connected between the output terminal $P_{OUT}$ of the linearizing circuit 300*a* and the node Nb.

The input terminal $P_{IN}$ of the linearizing circuit 300*b* may be connected to the input terminal IN_100*a* of the power transistor 100*a*, and the linearizing circuit 300*b* may couple a portion of the input RF signal $RF_{IN}$.

The switch SW1_1 may be connected between the output terminal $P_{OUT}$ of the linearizing circuit 300*b* and the node Na. The switch SW2_1 may be connected between the output terminal $P_{OUT}$ of the linearizing circuit 300*b* and the node Nb.

The switches SW1_1, SW1_2, SW2_1, and SW2_2 may be switched depending on a power mode of the power amplifier 1000*c*. The switch SW2_1 and the switch SW2_2 may be turned on and the switch SW1_1 and the switch SW1_2 may be turned off in a first power mode, and the switch SW1_1 and the switch SW1_2 may be turned on and the switch SW2_1 and the switch SW2_2 may be turned off in a second power mode. The first power mode is a mode for generating an output power (a gain) lower than an output power (a gain) in the second power mode. As an example, the first power mode may be a low-power mode (LPM), and the second power mode may be a high-power mode (HPM).

Figure 6A:
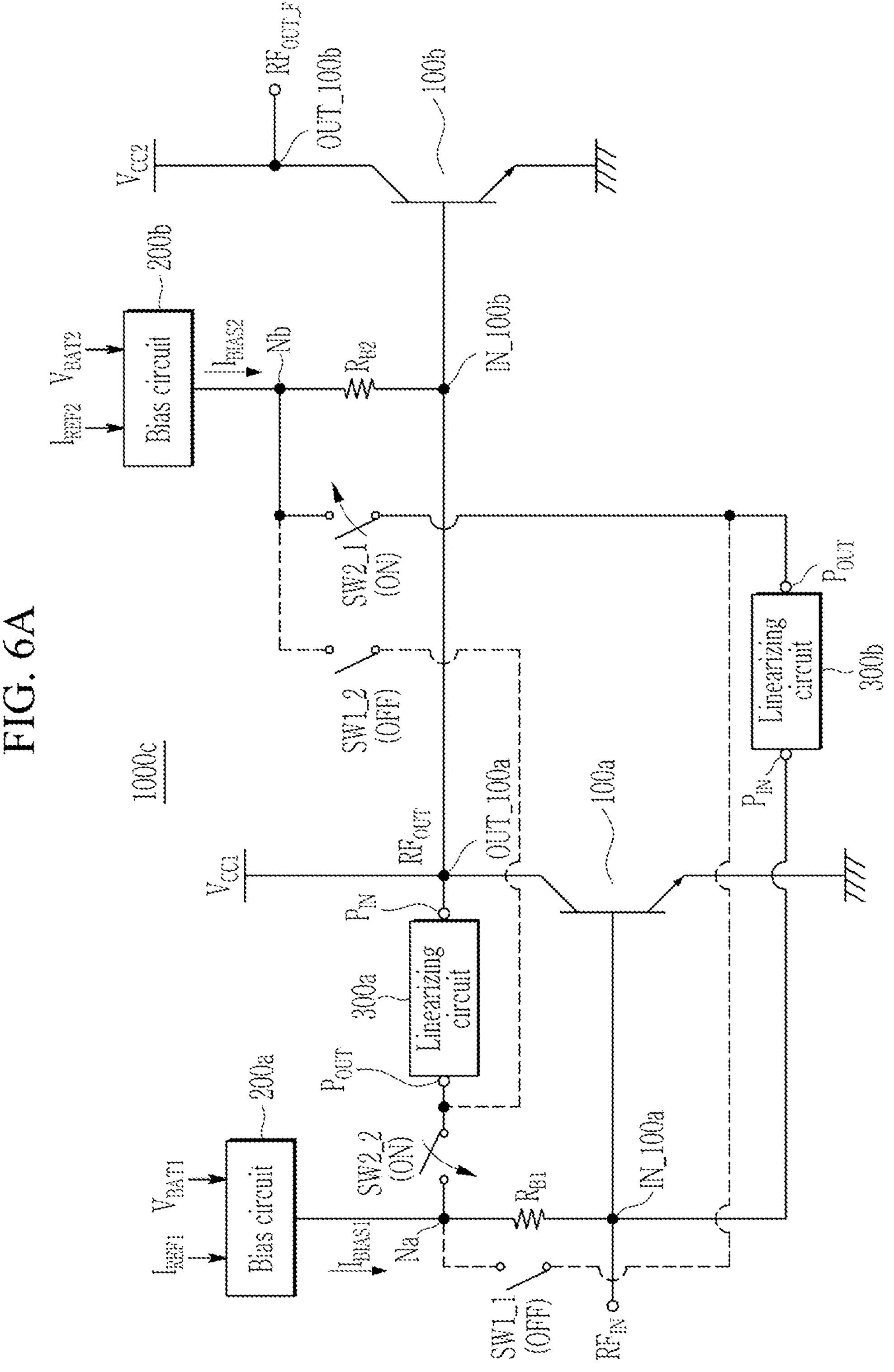
FIG. 6A is a drawing illustrating the operation of a power amplifier of FIG. 5 in a first power mode.

FIG. 6A is a drawing illustrating the operation of the power amplifier of FIG. 5 in the first power mode.

Referring to FIG. 6A, in the first power mode, the switch SW2_1 and the switch SW2_2 are turned on, and the switch SW1_1 and the switch SW1_2 are turned off.

By turning on the switch SW2_2, the output terminal $P_{OUT}$ of the linearizing circuit 300*a* may be connected to the node Na. Accordingly, the linearizing circuit 300*a* may couple a portion of the output RF signal $RF_{OUT}$, and output the coupled RF signal to the node Na. Since the magnitude (power) of the input RF signal $RF_{IN}$ in the first power mode is smaller than the magnitude (power) of the input RF signal $RF_{IN}$ in the second power mode, the linearizing circuit 300*a* may couple the output RF signal $RF_{OUT}$ that is an amplified signal. In other words, since the magnitude (power) of the output RF signal $RF_{OUT}$ is larger than the magnitude (power) of the input RF signal $RF_{IN}$, the linearizing circuit 300*a* may couple the output RF signal $RF_{OUT}$, not the input RF signal $RF_{IN}$. Accordingly, the linearizing circuit 300*a* can compensate more greatly for a drop in the base voltage of the power transistor 100*a*.

By turning on the switch SW2_1, the output terminal $P_{OUT}$ of the linearizing circuit 300*b* may be connected to the node Nb. Accordingly, the linearizing circuit 300*b* may couple a portion of the input RF signal $RF_{IN}$, and output the coupled RF signal to the node Nb. In other words, the linearizing circuit 300*b* may couple a portion of the input RF signal $RF_{IN}$, and output the coupled RF signal to the node Nb, thereby compensating for a drop in the base voltage of the power transistor 100*b*.

Figure 6B:
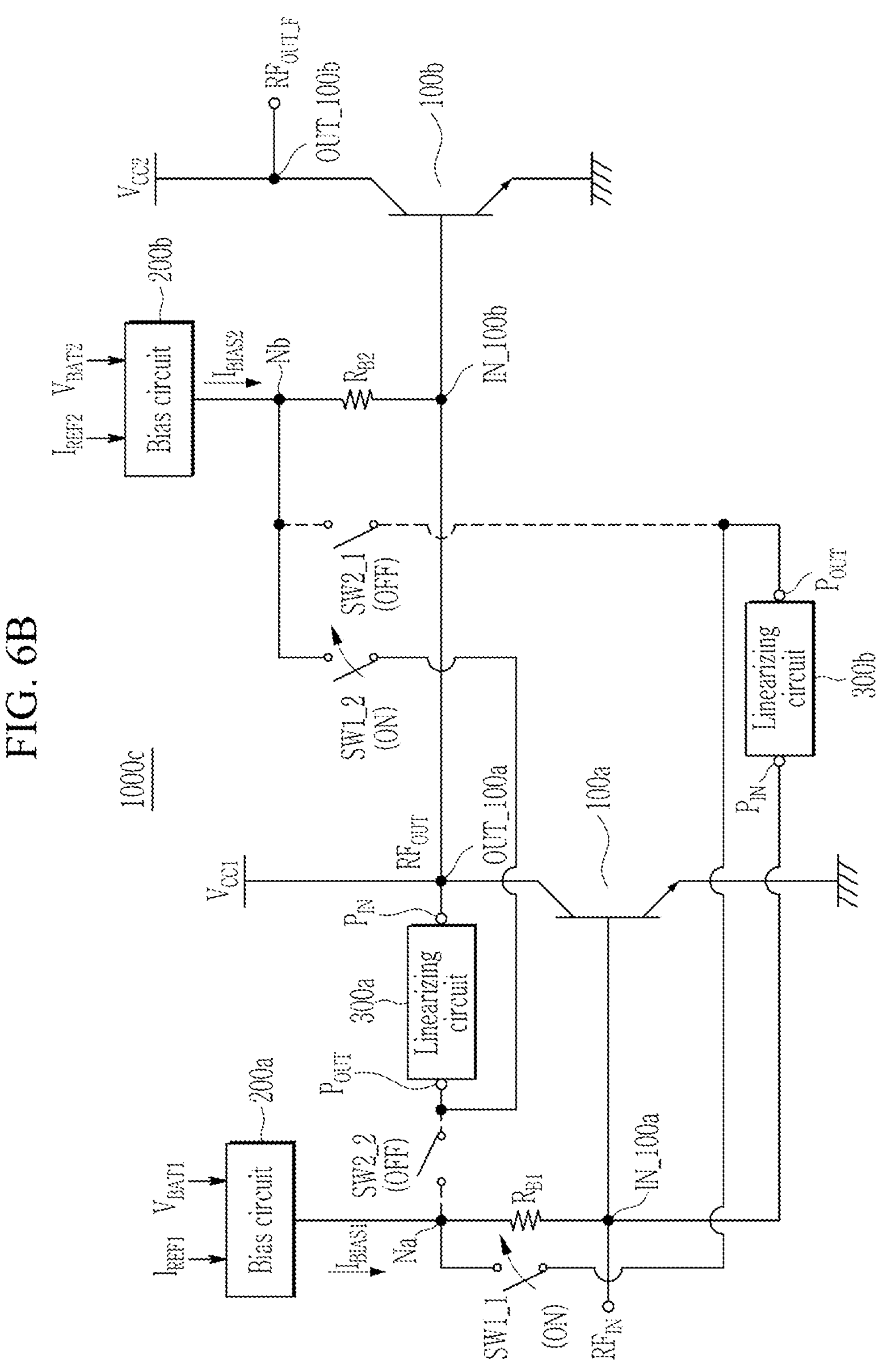
FIG. 6B is a drawing illustrating the operation of the power amplifier of FIG. 5 in a second power mode.

FIG. 6B is a drawing illustrating the operation of the power amplifier of FIG. 5 in the second power mode.

Referring to FIG. 6B, in the second power mode, the switch SW1_1 and the switch SW1_2 are turned on, and the switch SW2_1 and the switch SW2_2 are turned off.

By turning on the switch SW1_1, the output terminal $P_{OUT}$ of the linearizing circuit 300*b* may be connected to the node Na. Accordingly, the linearizing circuit 300*b* may couple a portion of the input RF signal $RF_{IN}$, and output the coupled RF signal to the node Na. Since the magnitude (power) of the input RF signal $RF_{IN}$ in the second power mode is larger than magnitude (power) of the input RF signal $RF_{IN}$ in the first power mode, the linearizing circuit 300*b* may couple the input RF signal $RF_{IN}$, thereby improving the linearity of the power amplifier 1000*c*. Accordingly, the linearizing circuit 300*b* can effectively compensate for a drop in the base voltage of the power transistor 100*a*.

By turning on the switch SW1_2, the output terminal $P_{OUT}$ of the linearizing circuit 300*a* may be connected to the node Nb. Accordingly, the linearizing circuit 300*a* may couple a portion of the output RF signal $RF_{OUT}$, and output the coupled RF signal to the node Nb. In other words, the linearizing circuit 300*a* may couple a portion of the output RF signal $RF_{OUT}$, and output the coupled RF signal to the node Nb, thereby compensating for a drop in the base voltage of the power transistor 100*b*.

Accordingly, the power amplifier 1000*c* can effectively improve the linearity of the power amplifier 1000*c* by adjusting an RF signal to be coupled depending on the power mode of the power amplifier 1000*c*.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier comprising:

a first power transistor configured to amplify an input radio-frequency (RF) signal, and output the amplified input RF signal as an output RF signal;

a first transistor comprising a first terminal configured to provide a first bias current to the first power transistor; and a first linearizing circuit connected between a terminal of the first power transistor from which the output RF signal is output and the first terminal of the first transistor and configured to couple a portion of the output RF signal to the first terminal of the first transistor.

2. The power amplifier of claim 1, further comprising:

a second power transistor configured to amplify the output RF signal of the first power transistor;

a second transistor comprising a first terminal configured to provide a second bias current to the second power transistor; and a second linearizing circuit connected between a terminal of the first power transistor to which the input RF signal is input and the first terminal of the second transistor and configured to couple a portion of the input RF signal to the first terminal of the second transistor.

3. The power amplifier of claim 1, wherein the first linearizing circuit comprises a capacitor connected between the terminal of the first power transistor from which the output RF signal is output and the first terminal of the first transistor.

4. The power amplifier of claim 3, wherein the first linearizing circuit further comprises a resistor connected in series with the capacitor between the terminal of the first power transistor from which the output RF signal is output and the first terminal of the first transistor.

5. The power amplifier of claim 3, wherein the first linearizing circuit further comprises an inductor connected in series with the capacitor between the terminal of the first power transistor from which the output RF signal is output and the first terminal of the first transistor.

6. The power amplifier of claim 1, further comprising a resistor connected between the first terminal of the first transistor and an input terminal of the first power transistor.

7. The power amplifier of claim 6, further comprising a capacitor connected between a base of the first transistor and a ground, wherein the first terminal of the first transistor is an emitter of the first transistor.

8. A power amplifier comprising:

a first power transistor configured to amplify an input radio-frequency (RF) signal and output the amplified input RF signal as an output RF signal;

a first bias circuit configured to generate a first bias current for biasing the first power transistor and comprising a first terminal from which the first bias current is output;

a second power transistor configured to amplify the output RF signal;

a second bias circuit configured to generate a second bias current for biasing the second power transistor and comprising a first terminal from which the second bias current is output; and a first linearizing circuit comprising an input terminal connected to a terminal of the first power transistor from which the output RF signal is output and configured to couple a portion of the output RF signal, wherein the first linearizing circuit is further configured to:

provide the coupled output RF signal to the first terminal of the first bias circuit in a first power mode, and provide the coupled output RF signal to the first terminal of the second bias circuit in a second power mode.

9. The power amplifier of claim 8, further comprising a second linearizing circuit comprising an input terminal connected to a terminal of the first power transistor to which the input RF signal is input and configured to couple a portion of the input RF signal, wherein the second linearizing circuit is further configured to:

provide the coupled input RF signal to the first terminal of the second bias circuit in the first power mode, and provide the coupled input RF signal to the first terminal of the first bias circuit in the second power mode.

10. The power amplifier of claim 9, wherein an input power of the input RF signal of the first power transistor in the first power mode is lower than the input power of the input RF signal of the first power transistor in the second power mode.

11. The power amplifier of claim 9, further comprising:

a first switch connected between an output terminal of the first linearizing circuit and the first terminal of the first bias circuit;

a second switch connected between the output terminal of the first linearizing circuit and the first terminal of the second bias circuit;

a third switch connected between an output terminal of the second linearizing circuit and the first terminal of the second bias circuit; and a fourth switch connected between the output terminal of the second linearizing circuit and the first terminal of the first bias circuit.

12. The power amplifier of claim 11, wherein the first switch and the third switch are configured to be turned on in the first power mode, and the second switch and the fourth switch are configured to be turned off in the first power mode, and the second switch and the fourth switch are further configured to be turned on in the second power mode, and the first switch and the third switch are further configured to be turned off in the second power mode.

13. The power amplifier of claim 9, further comprising:

a first resistor connected between the first terminal of the first bias circuit and an input terminal of the first power transistor; and a second resistor connected between the first terminal of the second bias circuit and an input terminal of the second power transistor.

14. The power amplifier of claim 13, wherein the first bias circuit comprises a first transistor, and an emitter of the first transistor is the first terminal of the first bias circuit, and the second bias circuit comprises a second transistor, and an emitter of the second transistor is the first terminal of the second bias circuit.

15. A power amplifier comprising:

a first power transistor comprising an input terminal and an output terminal, the input terminal of the first power transistor being configured to receive an input radio-frequency (RF) signal, and the first power transistor being configured to amplify the input radio-frequency RF signal and output the amplified input RF signal as an output RF signal from the output terminal of the first power transistor;

a first transistor comprising a first terminal configured to provide a first bias current to the first power transistor; and a first linearizing circuit connected between the output terminal of the first power transistor and the first terminal of the first transistor and configured to compensate for a drop in a voltage of the input terminal of the first power transistor as an input power of the input RF signal of the first power transistor increases based on the output RF signal of the first power transistor.

16. The power amplifier of claim 15, wherein the first linearizing circuit is further configured to compensate for the drop in the voltage of the input terminal of the first power transistor by coupling a portion of the output RF signal of the first power transistor to the first terminal of the first transistor.

17. The power amplifier of claim 15, further comprising:

a second power transistor comprising an input terminal and an output terminal, the input terminal of the second power transistor being configured to receive the output RF signal of the first power transistor, and the second power transistor being configured to amplify the output RF signal of the first power transistor and output the amplified output RF signal as a final output RF signal from the output terminal of the second power transistor;

a second transistor comprising a first terminal configured to provide a second bias current to the second power transistor; and a second linearizing circuit connected between the input terminal of the first power transistor and the first terminal of the second transistor and configured to compensate for a drop in a voltage of the input terminal of the second power transistor as the input power of the first power transistor increases based on the input RF signal of the first power transistor.

18. The power amplifier of claim 17, wherein the second linearizing circuit is further configured to compensate for the drop in the voltage of the input terminal of the second power transistor by coupling a portion of the input RF signal of the first power transistor to the first terminal of the second transistor.

19. The power amplifier of claim 17, further comprising:

a first switch connected between an output terminal of the first linearizing circuit and the first terminal of the first transistor;

a second switch connected between the output terminal of the first linearizing circuit and the first terminal of the second transistor;

a third switch connected between an output terminal of the second linearizing circuit and the first terminal of the second transistor; and a fourth switch connected between the output terminal of the second linearizing circuit and the first terminal of the first transistor.

20. The power amplifier of claim 19, wherein the first switch and the third switch are configured to be turned on in a first power mode, and the second switch and the fourth switch are configured to be turned off in the first power mode, the second switch and the fourth switch are further configured to be turned on in a second power mode, and the first switch and the third switch are further configured to be turned off in the second power mode, and the input power of the input RF signal of the first power transistor in the first power mode is lower than the input power of the input RF signal of the first power transistor in the second power mode.

* * * * *